United States Patent
Kim et al.

(10) Patent No.: US 8,400,200 B1
(45) Date of Patent: Mar. 19, 2013

(54) SYSTEMS AND METHODS INCLUDING FEATURES OF POWER SUPPLY NOISE REDUCTION AND/OR POWER-SAVING FOR HIGH SPEED DELAY LINES

(75) Inventors: Jae Hyeong Kim, San Ramon, CA (US); Jyn-Bang Shyu, Cupertino, CA (US); Lee-Lean Shu, Los Altos, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 65 days.

(21) Appl. No.: 13/179,520

(22) Filed: Jul. 9, 2011

(51) Int. Cl.
*H03L 7/06* (2006.01)
(52) U.S. Cl. ........................... 327/158; 327/149
(58) Field of Classification Search ............ 327/149, 327/158
See application file for complete search history.

(56) References Cited

U.S. PATENT DOCUMENTS

| | | | |
|---|---|---|---|
| 5,287,025 A | 2/1994 | Nishimichi | |
| 7,199,634 B2 | 4/2007 | Cho et al. | |
| 7,208,989 B2 | 4/2007 | Deivasigaman et al. | |
| 7,259,604 B2 * | 8/2007 | Gomm | 327/175 |
| 7,602,224 B2 * | 10/2009 | Lee | 327/158 |
| 7,671,651 B2 | 3/2010 | Kim | |
| 7,701,273 B2 | 4/2010 | Choi | |
| 7,791,388 B2 | 9/2010 | Gomm | |
| 7,830,185 B2 | 11/2010 | Kim et al. | |
| 7,952,406 B2 * | 5/2011 | Chung | 327/158 |
| 7,977,986 B2 * | 7/2011 | Lee | 327/158 |
| 7,995,416 B2 * | 8/2011 | Yon et al. | 365/226 |
| 8,130,017 B2 * | 3/2012 | Lee | 327/158 |
| 8,138,809 B2 * | 3/2012 | Ma | 327/158 |
| 2007/0086267 A1 * | 4/2007 | Kwak | 365/233 |
| 2008/0036514 A1 * | 2/2008 | Tai | 327/158 |
| 2008/0100356 A1 * | 5/2008 | Lee | 327/158 |
| 2008/0284475 A1 * | 11/2008 | Lee | 327/149 |
| 2009/0278580 A1 | 11/2009 | Kim | |
| 2009/0302909 A1 * | 12/2009 | Lee | 327/158 |
| 2010/0194457 A1 | 8/2010 | Choi | |
| 2010/0239234 A1 * | 9/2010 | Ma | 386/117 |
| 2011/0001525 A1 * | 1/2011 | Chung | 327/158 |
| 2011/0025389 A1 | 2/2011 | Ma | |
| 2011/0037504 A1 * | 2/2011 | Lee | 327/158 |
| 2011/0227620 A1 * | 9/2011 | Lee | 327/158 |
| 2012/0086486 A1 * | 4/2012 | Na et al. | 327/158 |
| 2012/0133405 A1 * | 5/2012 | Jain et al. | 327/159 |
| 2012/0154001 A1 * | 6/2012 | Seo | 327/158 |
| 2012/0194241 A1 * | 8/2012 | Shin | 327/158 |
| 2012/0274374 A1 * | 11/2012 | Ma | 327/158 |

FOREIGN PATENT DOCUMENTS

JP        09294142 A        11/1997

* cited by examiner

*Primary Examiner* — Adam Houston
(74) *Attorney, Agent, or Firm* — DLA Piper LLP (US)

(57) ABSTRACT

The present disclosure relates to systems and methods of noise reduction and/or power saving. According to one or more illustrative implementations, for example, innovations consistent with delay lines in clock/timing circuits such as Delay-Lock-Loop (DLL) and/or Duty Cycle Correction (DCC) circuits are disclosed.

20 Claims, 7 Drawing Sheets

SYSTEMS AND METHODS INCLUDING FEATURES OF POWER SUPPLY NOISE REDUCTION AND/OR POWER-SAVING FOR HIGH SPEED DELAY LINES

BACKGROUND

1. Field

The present inventions relate to systems and methods of noise reduction and/or power saving, and, more specifically, to innovations consistent with delay lines in clock/timing circuits such as Delay-Lock-Loop (DLL) and/or Duty Cycle Correction (DCC) circuits.

2. Description of Related Information

Clock generators based on Delay-locked Loop (DLL) and Duty Cycle Correction (DCC) circuits can be used to change the on-chip internal clock phases. Here, for example, a DLL may align the rising edges of the internal clock signal with the external input clock, and a DCC may adjust the falling edges of the internal clock to have a desired (50%) duty cycle even when the external input clock does not have a 50% duty cycle. As such, a DLL/DCC-based clock generator can usually enhance the clock edge-to-data output valid timing characteristics of high speed integrated circuits such as Double-Data-Rate (DDR) DRAM and SRAM devices. In general, high speed and high performance DLL and DCC circuits are designed with a multiple of delay lines which consists of many delay cells in series and controlled by the outputs of shift registers. Such delay cells in the delay line can be built based either on a differential type for good power noise immunity or on the single-ended type for its low power consumption. Furthermore, the differential type delay cells are often used for high speed operation due to their small voltage swing, but these cells will consume a large amount of DC current. Each delay cell is controlled by the voltage output of a charge pump which has phase difference information between input reference clock and internal feedback clock.

For the differential type of delay cells and delay line, the circuitry needs to convert the clock signals from the differential output to the single-ended output or from the single-ended input to the differential input to communicate with the internal digital CMOS logics.

In order to save the locking time and to stabilize the internal clock generated from DLL or DCC, these delay lines typically must be made available right away when DLL and DCC are enabled. At that time, the DLL and/or DCC will demand a lot of power because conventionally all delay cells in the delay lines are made available for searching the digital locking position.

In addition, to address issues such as coverage of wider locking frequency ranges, the quantity of delay cells is increasing in accordance with the goal of achieving such wider frequency range(s). Moreover, in some existing implementations, un-used delay cells are often never switched off and/or not powered down. Indeed, inherent issues such as these may often mean that total current consumption of both DLL and DCC is increasing proportional to a total number of delay cells being used. As such, higher speed DLL and DCC designs typically consume more power than the lower speed DLL and DCC designs. Indeed, in high speed applications, each delay cell may easily consume a few hundred microamps (uA) of DC current or sometimes even more.

Existing systems sometimes use a method of turning on all delay cells at the same time in the delay lines of both DLL and DCC when they are activated to shorten the locking time and to stabilize the internal clock more quickly. However, doing so creates a large surge current which, in some applications, can be around a few hundred milliamps or larger. Such large peak current will make a correspondingly large voltage jump in the internal power supply as it attempts to supply such a large internal current instantly. Furthermore, the DLL and DCC are usually very sensitive to power supply fluctuations/ noises. If the DLL and DCC see a large voltage jump on its power supply, it may take the DLL out of its locking state and create incorrect phase information for the whole chip.

For example, FIG. 1 depicts an existing illustration of a differential type delay line with a series of shift registers 120A, 120B, 120C, with Vdd input 134, and control waveforms 142, 132, 102, 148. Here, all the differential type delay cells 110A, 110B, 110C are turned on and wait for the control of the outputs of shifter registers to be selected. Behavior of the various signals show in the circuit, such as a clock signal (here, divided by 8) 130, up/down enable 132, and outputs of the shift registers (Q) 140A, 140B, 140C, is illustrated on the right side of FIG. 1 via waveforms including enable all cells 142, up/down enable 132, clock 102 and select (shift register output/Q) 148.

FIG. 2 illustrates some representative timing diagrams of the existing design shown in FIG. 1. Illustrated from top to bottom in FIG. 2 are enable all cells 153, clock 150, up/down enable 151, first through fourth select lines 152, 154, 156, 158, total current 162 and chip power supply 170. Before the phase-locking condition is achieved, all the registers 120 of the shift register are turned on, as shown in the drawing via the enable all cells signal 153. This corresponds to a jump 164 in the total current. Then, after a phase-lock condition occurs, the unused delay cells are turned off, i.e., once at lock 160, to save power 166. Accordingly, such circuits may create large current jump or spike 168 with the adverse effects of supply voltage dropping 172, then jumping up 174 and dropping down 176, creating fluctuations in internal chip power supply 170.

Accordingly, because of fluctuations such as these, chips often need to have numerous very wide power buses and also a large amount of de-coupling capacitors to stabilize its internal clock signal. These additional circuits demand more silicon area and thus adversely increase the overall cost of the integrated circuits.

DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the invention, examples of which are being illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

In one illustrative implementation, for example, the innovations herein may comprise a clock/phase component, such as a component or circuit associated with clock provision, phase detection, or other related clock signal processing. Further, such clock/phase component may include DLL/DCC circuitry including a plurality of delay cells, and a digital locking-search state machine configured to initiate a digital phase locking procedure in the clock/phase circuitry, turn on only a first cell or subgroup (N) of the delay cells upon activation of a DLL/DCC circuitry for the first time, and turn on an increasing quantity of the remaining delay cells, individually and/or in installments of small subgroups, over time. Accordingly and/or in connection with other features herein, power consumption and/or current or voltage spikes in the clock/phase circuitry may be reduced.

For example, consistent with aspects of the present innovations, DLL and/or DCC current may be turned on gradually, as needed/as appropriate, throughout the digital locking procedure instead of rapidly turning on all its delay cells at once.

Further, by means of some innovations herein, various noises and internal voltage jumps may be reduced. Moreover, systems and methods herein may also stabilize the locking time(s) more quickly. Aspects of the present innovations may also be applied to all the delay cells, such as all those based on the differential type delay cells inside the DLL and DCC.

Figure 3:
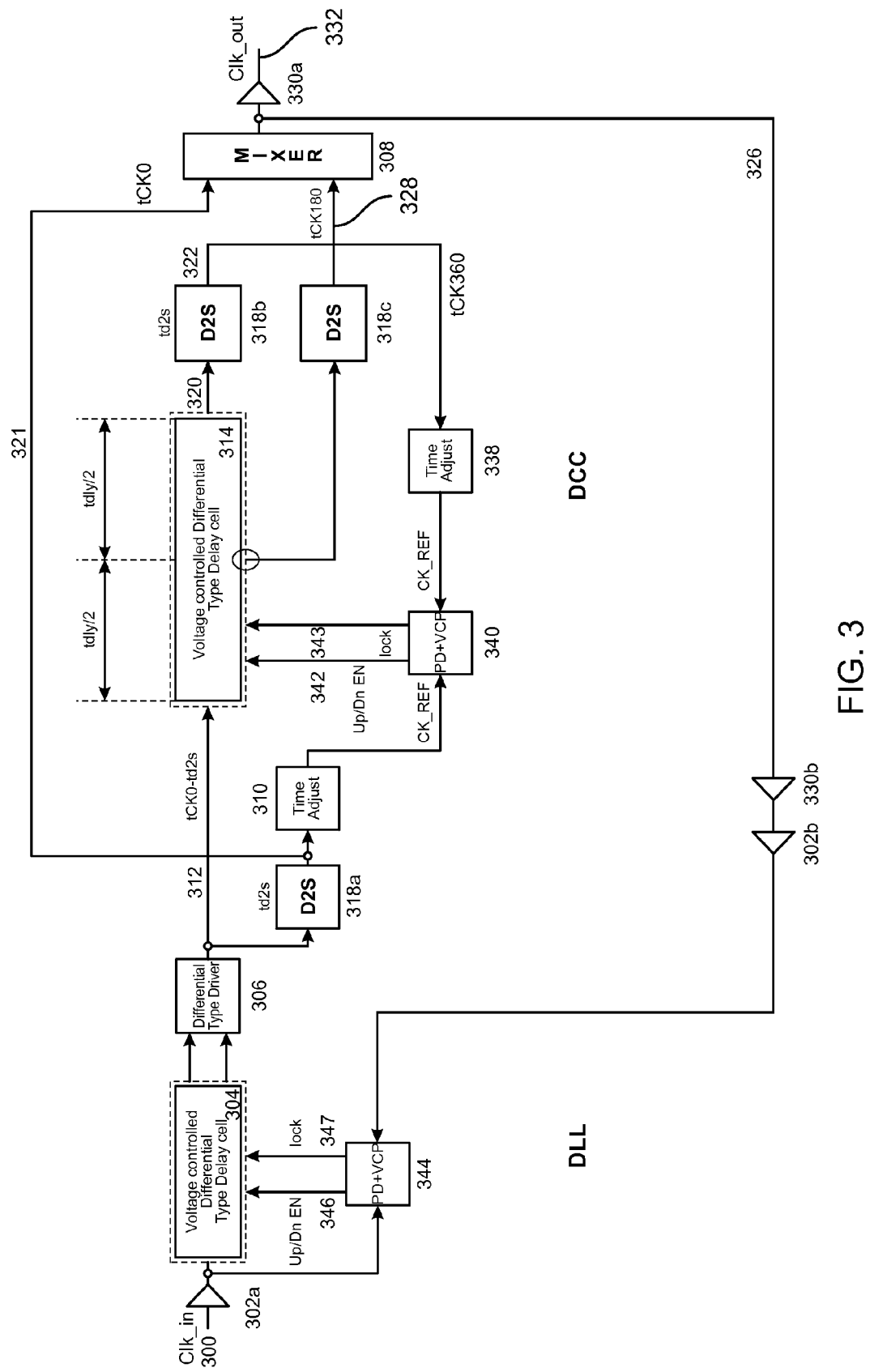
FIG. 3 is a block diagram of an exemplary mixed-mode DLL/DCC circuit consistent with certain aspects related to the innovations herein.

FIG. 3 is a block diagram of an exemplary mixed-mode DLL/DCC circuit consistent with certain aspects related to the innovations herein. As shown, FIG. 3 depicts a simplified block diagram of this new mixed-mode DLL/DCC architecture design. The illustrative circuitry of FIG. 3 includes two exemplary voltage-controlled differential-type delay cells 304 and 314 consistent with the present innovations. Further, the illustrative circuitry may also includes buffers 302 such as input buffer 302a, differential-type driver 306, differential to single-ended converters (D2S) 318a-c, timing adjustment circuitry 310, a mixer 308 such as a clock mixer, buffers 330 such as an output buffer 330a, a mimic output buffer 330b and a mimic input buffer 302b, an additional timing adjustment circuitry 338, and/or control circuitry such as phase detector/voltage charge pump (PD+VCP) circuitry 340, 344. Moreover, such control circuitry may be configured to provide both an up/down enable signal 342, 346 and a lock signal 343, 347 to the various delay cell circuits.

Further, in the representative circuit of FIG. 3, the DCC may generate a 180-degree phase-shifted output clock 328 (i.e. tCK180) from the output clock 322 of DLL (i.e. tCK0) when the phase detector and charge-pump circuit 344 have detected that the phase-lock condition is achieved. The clock mixer may also be included to combine both tCK0 and tCK180 rising edges to generate a duty-cycle balanced output clock 326, e.g., by aligning the output rising edges with the rising edges of tCK0 and aligning the output falling edges with the rising edges of tCK180.

In operation, according to certain implementations, the number of delay cells may be added incrementally (e.g., one by one, and/or in small sub-groups, etc.) until a phase-locking state is being achieved. Here, for example, when the chip activates the DLL/DCC at the first time, only a small sub-group of N delay cells in the delay line may be turned on initially to save the power consumption and also to minimize the current spikes of the delay line. For example, the smallest N delay cells which will be turned on initially can be selected to be either one delay cell (i.e. N=1) or five delay cells (i.e. N=5) before the locking-search process. If the first five delay cells in the delay lines will be initially turned on, it can provide more turn-on timing margin for the rest of delay cells in the delay line during the locking-search process.

Additionally, during this locking-search process, the digital locking-search state machine may turn on the delay cells in the delay line one by one to minimize the current spikes and also to save the power consumption by only turning on the delay cells that are desired or needed, such as which are selected for aligning the phases between the external reference clock edges and the internal feedback clock edges.

Turning back to operation, when the DLL is phase-locked, the DCC circuitry may be enabled to initiate its phase alignment process. Here, the DCC may begin a similar process as DLL by first enabling both the $1^{st}$ delay cell and the $2^{nd}$ delay cell with the $2^{nd}$ delay cell in standby mode. If the phase of the DCC output clock 321 is not in-line with its input clock 322, as determined by a phase detector (PD) of the DCC, its control logic will add the 2nd delay cell in its delay line accordingly. Furthermore, it will power-up the $3^{rd}$ delay cell to keep it in its standby mode and it will also keep the $1^{st}$ delay cell powered-up to provide the needed timing delay for the DCC delay line. This delay cell power-up and evaluation process may then be iterated in continued progression throughout the timing/delay-adjustment circuitry until the DCC reaches the phase-locking state. When the DCC is locked, its lock signal becomes high and it will latch the associated signal/information as its final selection.

Additionally, in accordance with one or more aspects of the innovations herein, the delay cells, such as via the RS latch, and/or control circuitry (e.g., etc.) may be configured to power up (enable, to a ready state) the next delay cell that may be selected, sequentially only as needed, yielding reduced power consumption. Thus each unused cell may be turned from an off state to a standby condition when it is about to be selected. Here, for example, once a first cell A is activated, cell B is then powered up/turned on, so as to be standing by to be activated if/as needed. This also reduces delay cell turn-on time, since needed cells are already powered up.

Finally, in the subsequent circuitry of the exemplary implementation of FIG. 3, after both DLL and DCC reach their phase-locking states, the clock mixer 308 may be configured to mix the output clocks 321, 328 of DLL and DCC and generate a phase-aligned and 50% duty-cycle output clock 326 as the whole system clock source.

Figure 4:
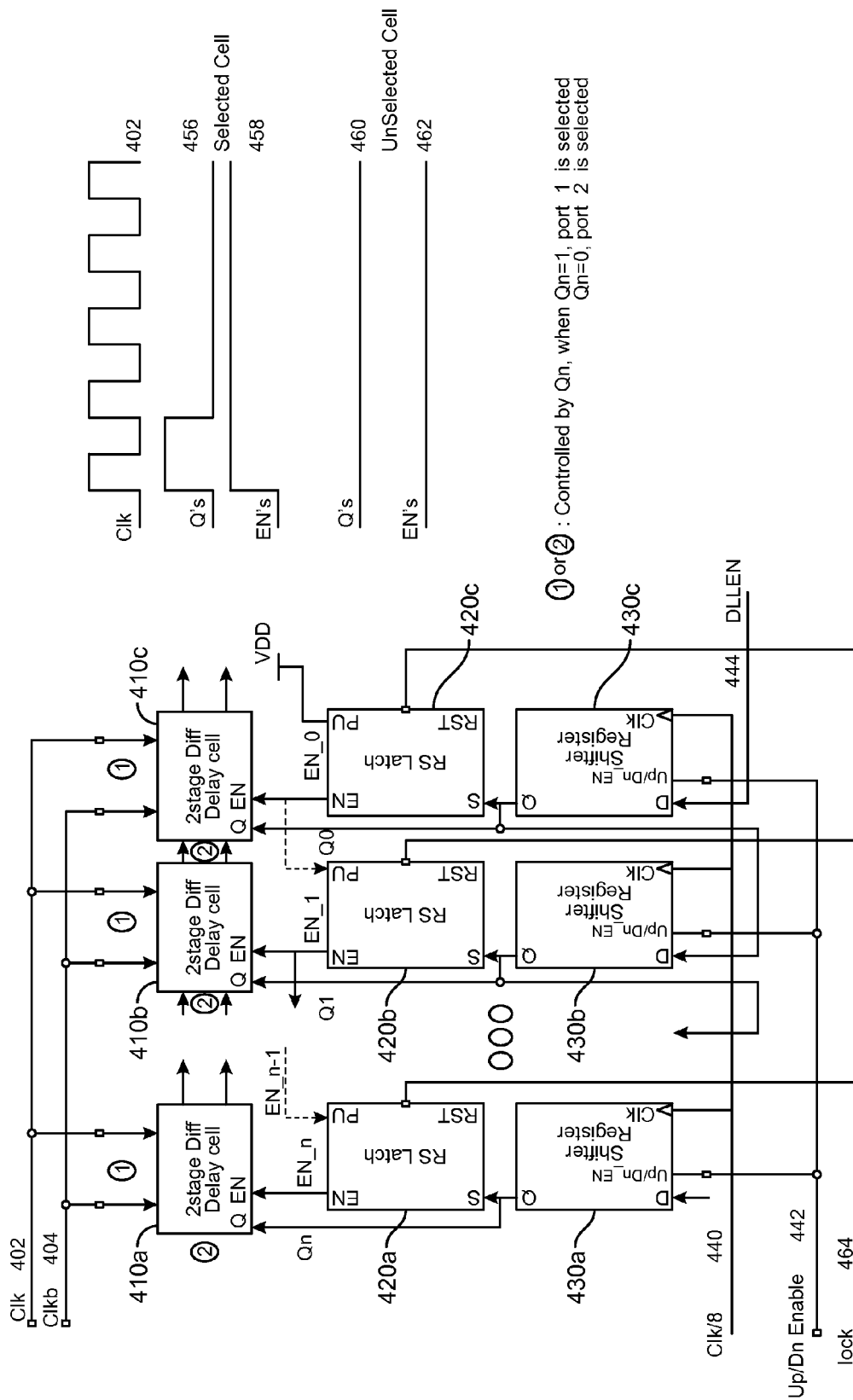
FIG. 4 is a block diagram of other illustrative circuitry consistent with certain aspects related to the innovations herein.

FIG. 4 is a block diagram of another exemplary circuit consistent with certain aspects related to the innovations herein. Referring to FIG. 4, innovations including a series of shift registers with associated power-up RS latches and its controlling waveforms are shown. FIG. 4 includes shift registers 430A, 430B and 430C, RS latches 420A, 420B and 420C, differential delay cells 410A, 410B and 410C, as well as waveforms 454-462 associated with various signals associated with these elements. Clock signals 402, 404 may be provided as inputs to the delay cells 410. Further, each delay cell 410 may comprise two ports, including a first port $\hat{1}$ and a second port $\hat{2}$, as well as a select input $Q_n$ that selects between enabling input from the first port or the second port as a function of being high or low, respectively. Additionally, another clock signal 440 as well as a DLL enable signal ($DLL_{EN}$) 444 may also be provided as inputs to the shift registers 430.

The waveforms illustrated in FIG. 4 include a clock signal 402, select (Q) 456 and enable (EN) 458 signals associated with a selected cell, and select (Q) 460 and enable (EN) 462 signals associated with an unselected cell. Further up/down enable 442 and lock 462 signals may be provided as inputs to the shift registers 430 and RS latches 420, respectively. Such up/down enable signals 442 may correspond, for example, to the up/down enable signals 342, 346 shown and described in connection with FIG. 3. Similarly, the lock signal(s) 462 may correspond to the lock signals 343, 347 shown and described in connection with FIG. 3. Via control provided by such signals, consistent with FIG. 4, when DLL and DCC get activated, innovative systems and methods herein may turn off all of the delay cells of its delay lines except for the first two delay cells (e.g. N=2) by the outputs of RS latches which are controlled by the phase-locking information and the previous information of the shift register(s).

As a function of verifying/confirming phase-locking position, the delay cells may be added one by one, as small sub-groups, in combination(s) thereof, or as set forth elsewhere herein. In some implementations, if the phase of the output clock is not in-line with the input reference clock, as determined by a phase detector (PD) of the DLL, the control logic may be activated to add or remove delay cell(s). Further, the first shift register 430C output may trigger the next shifter register 430B to be activated and check the lock signal. If the lock signal is low, for example, the output of the $2^{nd}$ shift register may send an enable signal to the next ($3^{rd}$) shift register until the phase-locking condition is achieved. This may continue through the succession of shift registers until phase is aligned. When the DLL is locked, its lock signal becomes high and it will latch the associated signal/information as its final selection.

Figure 5:
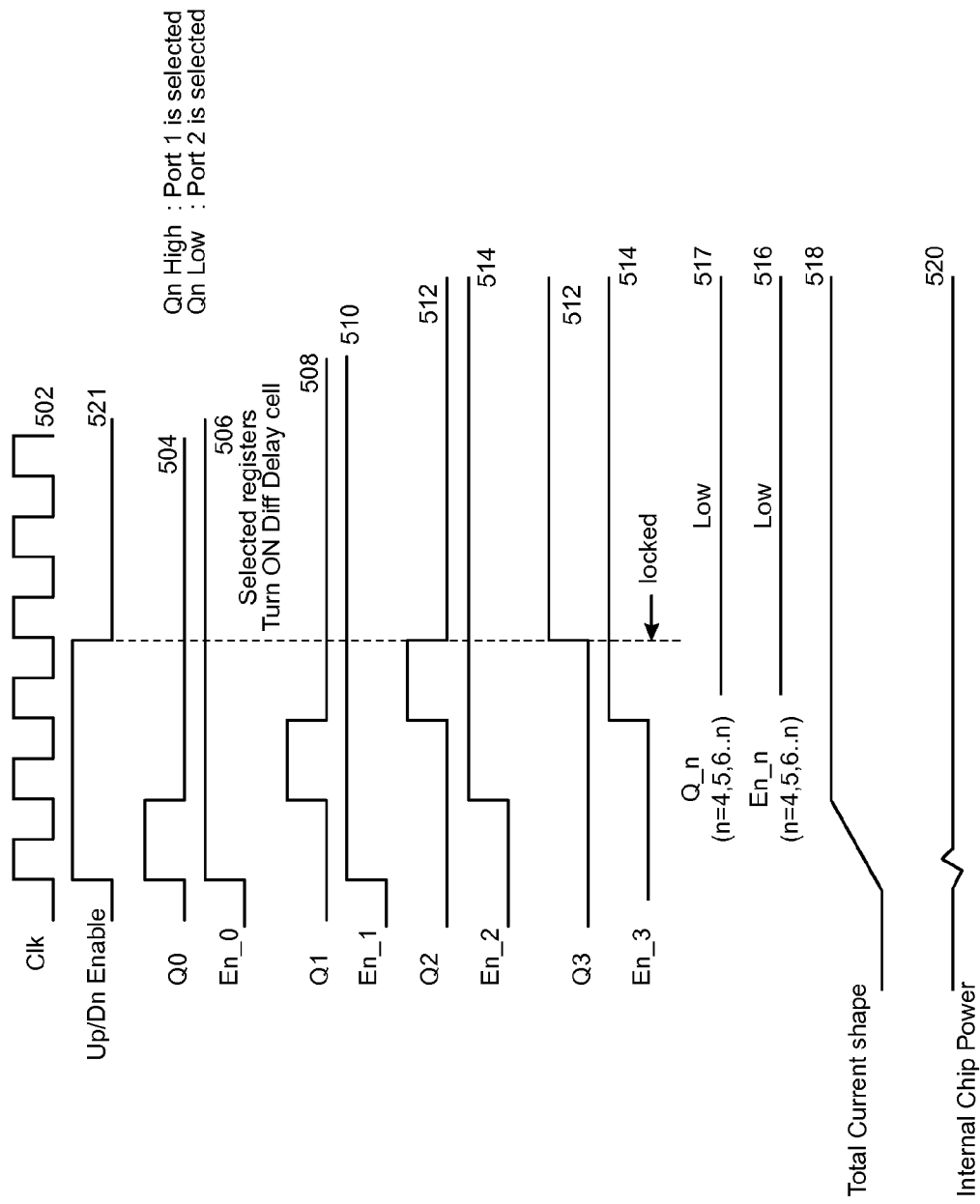
FIG. 5 illustrates an exemplary timing diagram of representative circuit(s) herein consistent with certain aspects related to the innovations herein.

FIG. 5 illustrates some representative timing diagrams consistent with the implementation shown in FIG. 4. Shown from top to bottom in FIG. 5 are lock clock 502, select and enable lines 504-517 for various delay cells, a total current signal 518, up/down enable 521, and a chip power supply signal 520. Before the phase-locking condition is achieved, the $1^{st}$ and $2^{nd}$ shift registers 430C, 430B and the $1^{st}$ and $2^{nd}$ RS latches 420C, 420B are turned on, as shown in the drawing by the on states of the select lines 504-510. This corresponds to a small ramp shown towards the beginning of the total current signal 518. In turn, such gradual/small current ramp generates only a small voltage fluctuation in internal chip power supply 520. If the phases of the DLL/DCC output clocks are not in-line with their input clocks, as determined by the phase detector (PD) of the DLL/DCC, their control logics will add the 2nd delay cell (or sub-group) in their delay line accordingly. Furthermore, they will power-up the $3^{rd}$ delay cell (or sub-group) to keep it in its standby mode and they will also keep the $1^{st}$ delay cell power-up to provide the needed timing delay for the DLL/DCC delay lines.

Figure 6:
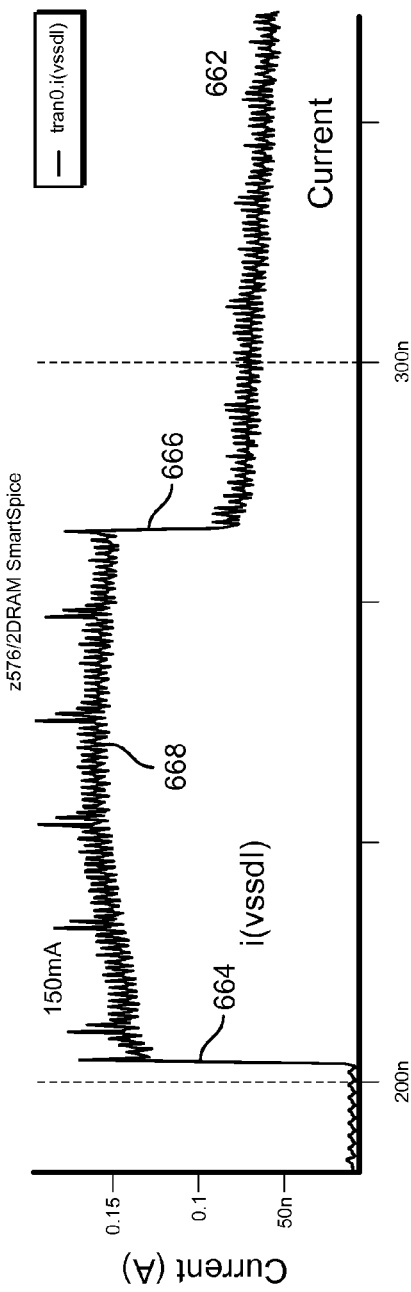
FIG. 6 is a graph illustrating an exemplary power current waveform of an existing circuit.
Figure 7:
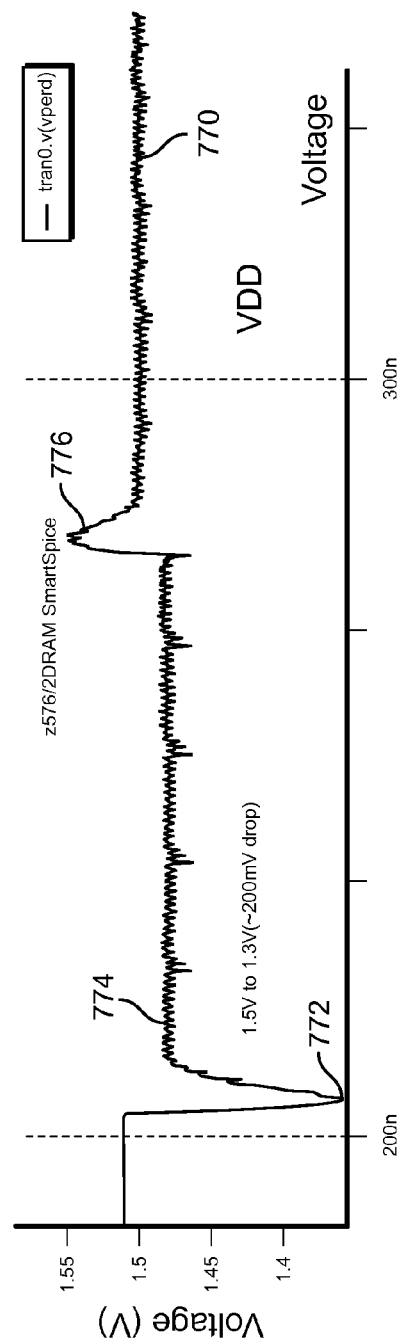
FIG. 7 is a graph illustrating an exemplary voltage drop waveform of an existing circuit.

FIG. 6 is a graph showing an illustrative power current waveform of an existing delay line circuit. FIG. 7 is a graph showing an illustrative voltage drop waveform of an existing delay line circuit. Referring to FIGS. 6-7, illustrative power current simulation results during power-up and locking position and power voltage drop results are shown.

Figure 1:
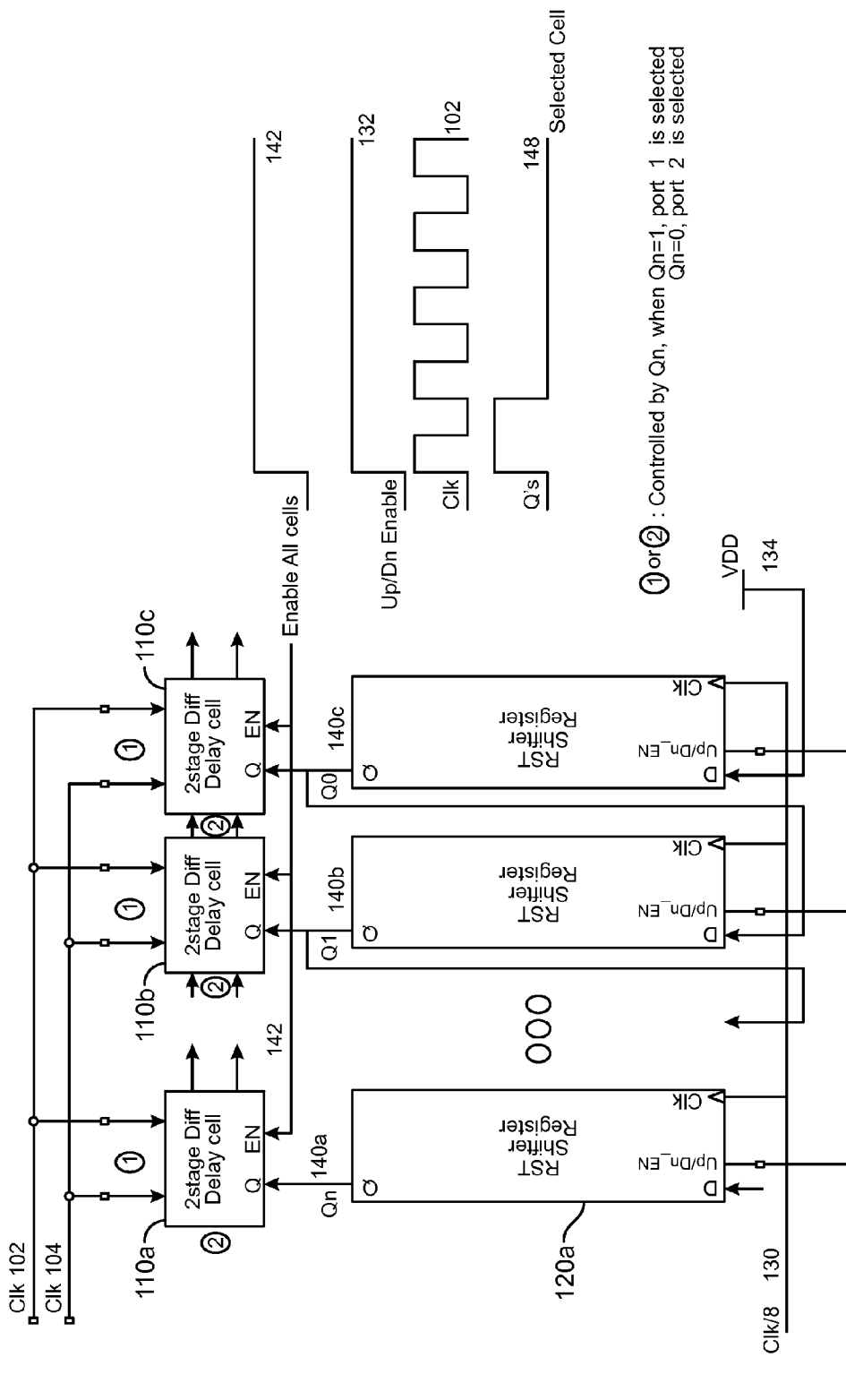
FIG. 1 is a diagram of an existing differential type delay cell circuit.
Figure 2:
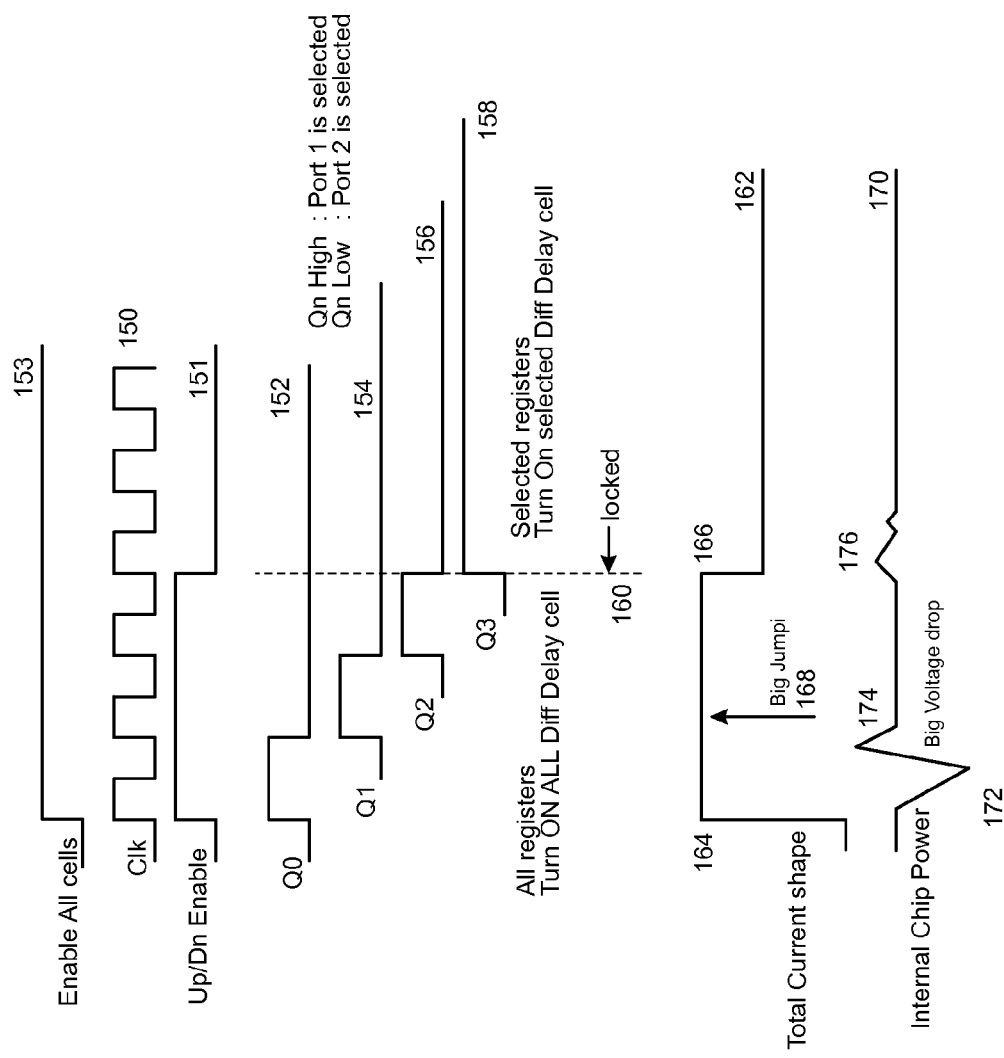
FIG. 2 illustrates timing diagrams consistent with the existing circuit of FIG. 1.

FIG. 6 and FIG. 7 illustrate the representative timing diagrams of the total supply current and the power supply voltage, respectively, corresponding to certain existing designs. FIG. 6, for example, shows the corresponding large jump 664 in the total current consistent with an existing delay line design, such as the design of FIG. 1. After a phase-lock condition occurs in such circuit, the unused delay cells are turned off, at 666, to use less current 662 and save power. Accordingly, the large current jump or spike 668 of such circuits may create adverse effects, such as a drop in supply voltage 772, with a jump back up 774, creating fluctuations in internal chip power supply 770, as shown in FIG. 7.

In summary, FIG. 6 shows a prior art current waveform, when DLL and DCC are activated, with a current surge 664 up to approximately 150 mA, then reduced to a level 662 of about 60 mA after locking. Further, FIG. 7 shows internal power voltage dropping 772 by about 220 mV from the 1.5V target voltage 770.

Figure 8:
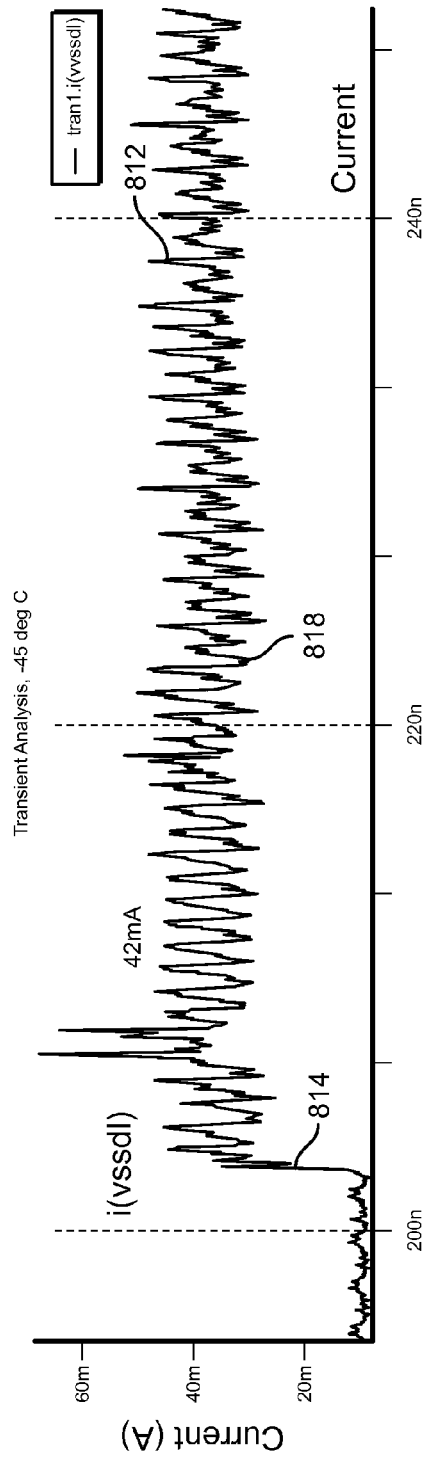
FIG. 8 is a graph illustrating an exemplary power current waveform consistent with certain aspects related to the innovations herein.
Figure 9:
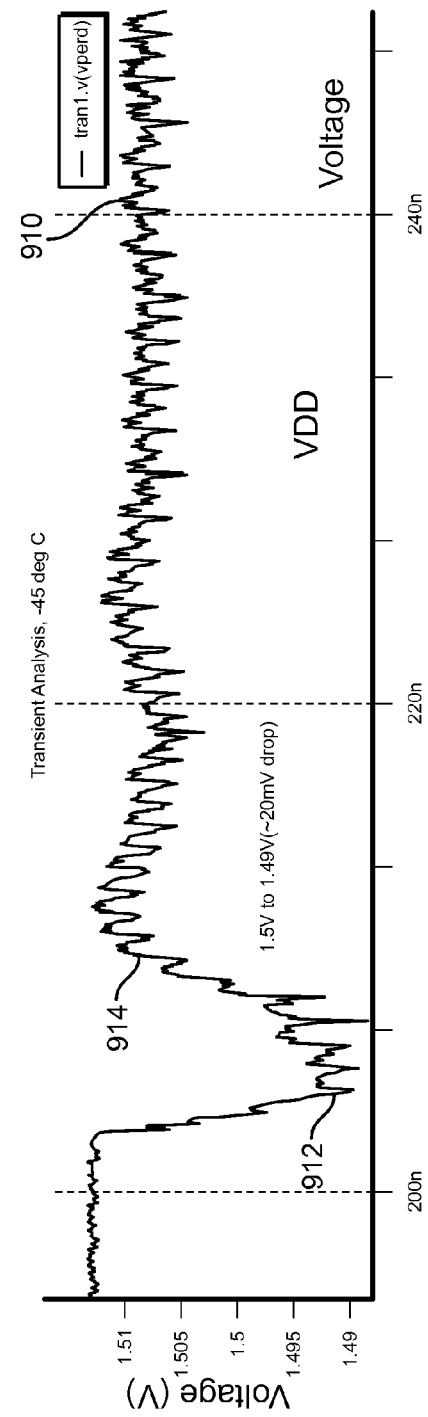
FIG. 9 is a graph illustrating an exemplary voltage drop waveform consistent with certain aspects related to the innovations herein.

FIG. 8 is a graph showing an illustrative power current waveform consistent with certain aspects related to the innovations herein. FIG. 9 is a graph showing an illustrative voltage drop waveform consistent with certain aspects related to the innovations herein. Referring to FIG. 8, power current results during power-up and locking conditions are depicted. Referring to FIG. 9, power voltage drop results during power-up and locking conditions are depicted.

FIG. 8 and FIG. 9 illustrate the representative timing diagrams of the total supply current and the power supply voltage, respectively, according to the innovative delay line designs and methods herein. Consistent with such designs, correspondingly smaller jumps 814 in the total current are present. Further, after phase-lock condition occurs, the unused delay cells are never turned on to save power, providing a lower current level 812. Accordingly, such circuits may yield a smaller current jump or spike 818, with a corresponding adverse effect of a smaller supply voltage drop 912, and jump back up 914, creating smaller fluctuations in the internal chip power supply 910.

Accordingly, as illustrated in FIGS. 8 and 9, the innovations herein may achieve peak currents 812 reduced from ~150 mA to ~40 mA, and also internal power voltage drops 912 reduced from ~220 mV to ~20 mV, as from a 1.5V target voltage 910.

Additionally, the innovations herein may be achieved via implementations with differing components, beyond the specific circuitry set forth above. With regard to such other components (e.g., circuitry, computing/processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to, various clock-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may occur from both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe components such as software, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

In accordance with the description and drawings herein, improved overall performance of delay lines of DLL and DCC consistent with aspects of the present inventions, among other innovations, are shown. Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the appended claims and the applicable rules of law.

The invention claimed is:

1. A method of operating delay cells associated with delay lock loop (DLL) and/or duty cycle correction (DCC) circuitry, the method comprising:
   initiating a phase locking procedure in clock/phase circuitry;
   upon activation of the DLL and/or DCC circuitry for the first time, turning on only a first subgroup (N) of the delay cells; and
   turning on an increasing quantity of the delay cells remaining off in installments of single cells and/or small subgroups over time until the phase-locking conditions of the DLL and/or DCC circuitry are achieved;
   wherein power consumption and/or current spikes in the clock/phase circuitry are reduced.

2. The method of claim 1 wherein the first subgroup (N) of delay cells comprises one delay cell.

3. The method of claim 1 wherein the first subgroup (N) of delay cells consists of one delay cell.

4. The method of claim 1 wherein each subgroup (N) of delay cells consists of one delay cell.

5. The method of claim 1 wherein the first subgroup (N) of delay cells comprises two delay cells.

6. The method of claim 1 wherein the first subgroup (N) of delay cells consists of two delay cells.

7. The method of claim 1 wherein the delay cells are turned on one by one.

8. The method of claim 1 wherein the first subgroup (N) of delay cells comprises five delay cells.

9. A clock/phase component comprising:
   delay lock loop (DLL) and/or duty cycle correction (DCC) circuitry including a plurality of delay cells; and
   a digital locking-search state machine configured to:
      initiate a digital phase locking procedure in clock/phase circuitry;
      upon activation of the DLL and/or DCC circuitry for the first time, turn on only a first subgroup (N) of the delay cells; and
      turn on an increasing quantity of the delay cells remaining off in installments of small subgroups over time;
   wherein power consumption and/or current spikes in the clock/phase circuitry are reduced.

10. The component of claim 9 wherein the first subgroup (N) of delay cells comprises one delay cell.

11. The component of claim 9 wherein the first subgroup (N) of delay cells consists of one delay cell.

12. The component of claim 9 wherein each subgroup (N) of delay cells consists of one delay cell.

13. The component of claim 9 wherein the first subgroup (N) of delay cells comprises two delay cells.

14. The component of claim 9 wherein the first subgroup (N) of delay cells consists of two delay cells.

15. The component of claim 9, wherein delay cell circuitry for each cell comprises a delay cell, an RS latch and a shift register.

16. The component of claim 9, wherein the circuitry further comprises control circuitry including a up/down enable signal and a lock signal to the delay cells.

17. The component of claim 9 wherein the DLL and/or DCC circuitry comprises a delay lock loop (DLL) circuit and a duty cycle correction (DCC) circuit.

18. The component of claim 17, wherein the DCC circuit will generate a 180 degree phase-shifted output clock from the output clock of the DLL circuit when a phase detector and charge-pump circuit of the DLL circuit has detected that the phase-locking condition is achieved.

19. The component of claim 17, wherein, after the DLL circuit and the DCC circuit achieve a phase-locking condition, a clock mixer is enabled to combine both tCK0 and tCK180 rising edges to generate a duty-cycle balanced output clock by aligning output rising edges with the rising edges of tCK0 and also aligning output falling edges with the rising edges of tCK180.

20. The component of claim 9, wherein an output clock of clock mixer circuitry is configured to generate a duty-ratio at or near fifty percent to ensure high speed double data rate (DDR) operations.

* * * * *